United States Patent [19]

Koshino et al.

[11] Patent Number: 4,729,966

[45] Date of Patent: Mar. 8, 1988

[54] PROCESS FOR MANUFACTURING A SCHOTTKY FET DEVICE USING METAL SIDEWALLS AS GATES

[75] Inventors: Yutaka Koshino, Yokosuka; Tatsuo Akiyama, Tokyo; Shunichi Hiraki, Hyogo, all of Japan

[73] Assignee: Kabushiki Kaisha Toshiba, Kawasaki, Japan

[21] Appl. No.: 843,833

[22] Filed: Mar. 26, 1986

Related U.S. Application Data

[63] Continuation of Ser. No. 643,395, Aug. 23, 1984, abandoned.

[30] Foreign Application Priority Data

Aug. 24, 1983 [JP] Japan ................................ 58-153166

[51] Int. Cl.⁴ ................... H01L 21/225; H01L 29/80; H01L 29/72
[52] U.S. Cl. .............................. 437/39; 437/176; 437/50; 437/58; 437/178; 437/200; 437/245; 437/984; 437/912; 437/44; 357/23.3; 357/22; 357/15
[58] Field of Search ............... 29/571, 576 W, 578, 29/590, 591; 148/1.5, 175, 187; 156/643, 656; 357/65, 47, 22, 23.1, 23.4, 55; 427/84

[56] References Cited

U.S. PATENT DOCUMENTS

| | | | |
|---|---|---|---|
| 3,969,745 | 7/1976 | Blocker, III | 357/22 |
| 4,194,935 | 3/1980 | Dingle et al. | 357/15 |
| 4,322,883 | 4/1982 | Abbas et al. | 29/578 |
| 4,389,768 | 6/1983 | Fowler et al. | 29/571 |
| 4,409,608 | 10/1983 | Yoder | 357/51 |
| 4,425,379 | 1/1984 | Vora et al. | 357/15 |
| 4,455,738 | 6/1984 | Houston et al. | 357/15 |
| 4,489,146 | 12/1984 | Bock et al. | 430/5 |
| 4,498,093 | 2/1985 | Allyn et al. | 357/22 |
| 4,521,952 | 6/1985 | Riseman | 357/15 |
| 4,532,532 | 7/1985 | Jackson | 357/15 |
| 4,566,941 | 1/1986 | Yoshida et al. | 156/643 |
| 4,608,589 | 8/1986 | Goth et al. | 357/34 |

OTHER PUBLICATIONS

Jadus, "Buried Field Effect Transistor", *IBM Tech. Disclosure Bulletin*, vol. 13, No. 6, Nov. 1970, pp. 1431–1432.

Primary Examiner—Brian E. Hearn
Assistant Examiner—William Bunch

[57] ABSTRACT

A first insulative film is formed with predetermined height and thickness in a loop shape on the surface of the Schottky-junction semiconductor substrate. A gate electrode metal film is formed with a predetermined height and thickness in a loop shape on the surface of the substrate along the inner surface of the first insulative film. A second insulative film is formed with a predetermined height and thickness in a loop shape on the surface of the substrate along the inner surface of the metal film. A channel consisting of a low concentration impurity layer, is formed in a loop shape inside the substrate directly under the metal film and the first and second insulative films. The source region consists of a high-concentration impurity layer formed such that it surrounds the channel positioned inside the substrate on the outside of the first insulative film. The drain region consists of a high-concentration impurity layer, which is formed such that it is surrounded by the channel positioned inside the substrate on the inside of the second insulative film.

6 Claims, 9 Drawing Figures

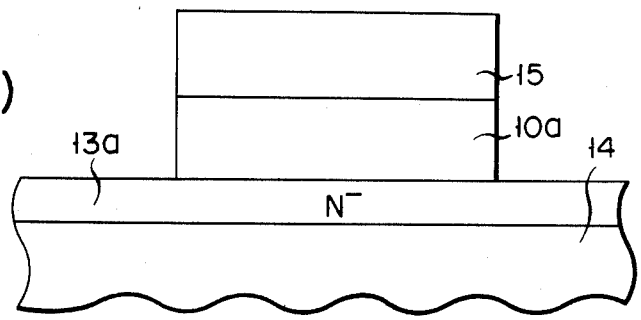
F I G. 3(a)
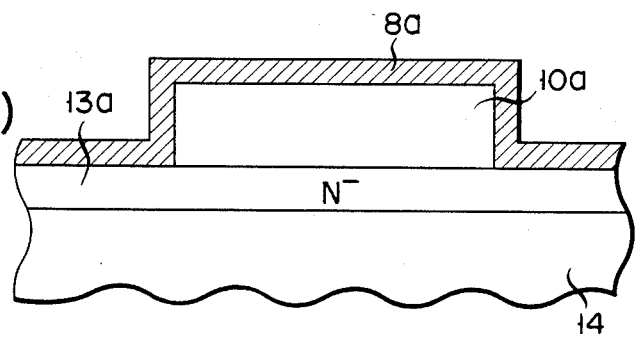
F I G. 3(b)
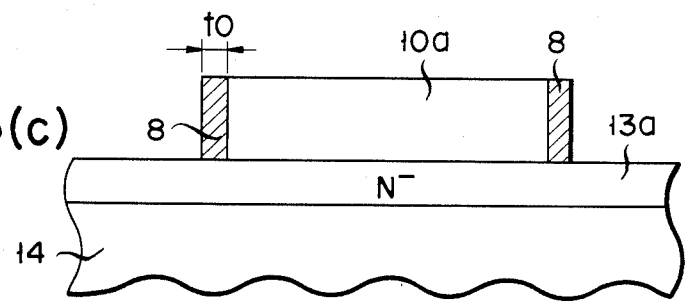
F I G. 3(c)
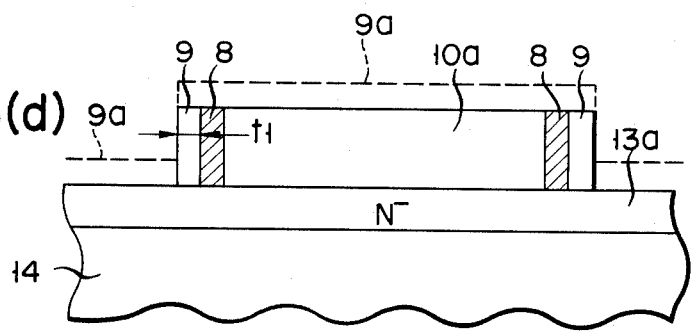
F I G. 3(d)

F I G. 3(e)
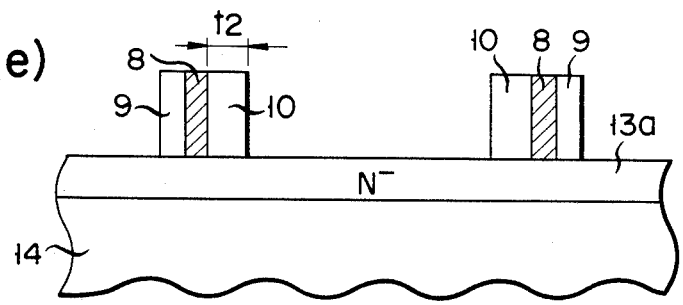
F I G. 3(f)
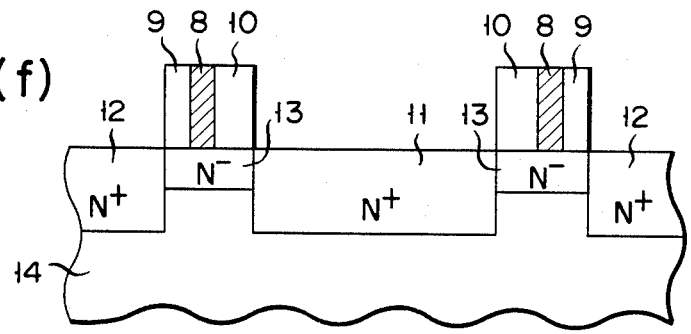
F I G. 3(g)
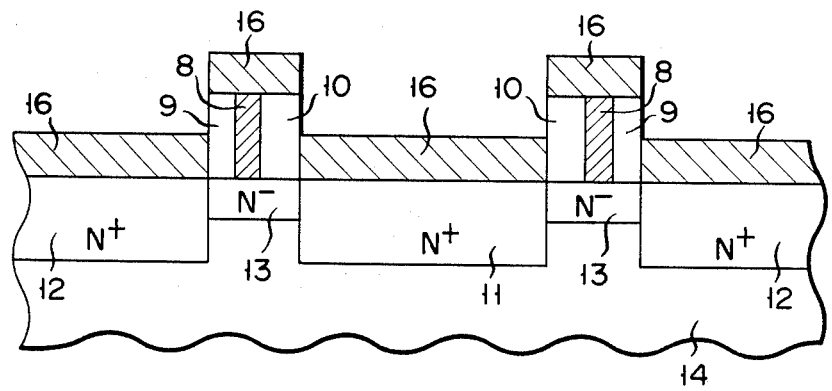

PROCESS FOR MANUFACTURING A SCHOTTKY FET DEVICE USING METAL SIDEWALLS AS GATES

This application is a continuation, of application Ser. No. 06/643,395, filed Aug. 23, 1984 abandoned.

BACKGROUND OF THE INVENTION

This invention relates to a Schottky FET device and a process for manufacturing the same, and in particular, to achieving an easy and effective increase in the mutual conductance of a GaAs FET.

GaAs FETs (field effect transistor), an example of which is the Schottky (junction) FET, are well-known as devices for microwave low-power signals and IC devices for high-speed, low-power-consumption applications.

FIG. 1 shows a simplified prior art GaAs-FET structure, which has a straight bar type gate electrode 1. A source electrode 2 and drain electrode 3, which have straight shapes similar to that of the gate electrode 1, are provided symmetrically separated by an equal distance from this gate electrode 1, which is in the center. FIG. 1 also shows a GaAs semiconductor substrate 4, a channel 5 formed of an N-type low-concentration impurity layer, which is formed on the semiconductor substrate 4, and source and drain regions 6 and 7 formed of N-type high-concentration impurity layers.

This kind of structure has the disadvantage of not being able to produce high performance devices for the following reasons. In the prior art GaAs FET manufacturing process, the source and drain electrodes are positioned symmetrically in relation to the gate electrode so that self-alignment techniques may be used. In this kind of structure, however, when the distance between the gate and source electrodes is decreased in order to increase the mutual conductance, the distance between the gate and drain electrodes is also decreased so the drain withstand voltage decreases. This means that there is a decrease in the distance margin, the result of which is a drastic degradation in manufacturing yield. Accordingly, in the past it has been impossible to improve the mutual conductance of the devices and still obtain a good manufacturing yield.

The reason the gate electrode of the prior art GaAs FET of FIG. 1 is made straight is in order to make it possible to use a lift-off manufacturing technique. This kind of straight gate electrode is not suitable for making high performance FETs. The lift-off technique is capable of producing narrow wiring lines but when the wiring is curved, it is extremely difficult to keep the width constant. Consequently, when such a lift-off technique is used the wiring must be designed without any curves, and accordingly, the gate electrode of the prior art GaAs FET also is formed straight using the lift-off technique.

However, in general in order to produce devices having high mutual conductance, it is necessary to increase the gate width W, so if the gate electrode is straight as in the prior art and one tries to achieve high mutual conductance in the devices, not only does the width of the gate increase, but that of the drain and source as well, which results in devices of large area. Accordingly, it is impossible to achieve compact, high-performance GaAs FETs with a structure such as that shown in FIG. 1, which has a straight gate electrode.

For these reasons, it is impossible with the prior art device structure to produce a GaAs FET of high mutual conductance without reducing the drain withstand voltage and reducing the manufacturing yield, and it is impossible to produce compact, area-efficient, high performance devices.

In order to solve these problems, the following methods have been proposed: (1) the distance between the source and gate electrodes is made short while that between the drain and gate electrodes is made long to thereby increase the mutual conductance and the drain withstand voltage, (2) by encircling the source or drain with a loop-shaped gate electrode, the gate width is increased, and high mutual conductance is obtained along with devices having high area efficiency. The first method, however, has the drawback that self alignment techniques cannot be used and it is impossible to sufficiently decrease the distance between the gate and source for greater patterning accuracy. No detailed, practical proposal has been made for the second manufacturing method.

SUMMARY OF THE INVENTION

It is, therefore, an object of the present invention to provide a new and improved process for manufacturing a high performance compact Schotty FET device in which the drain withstand voltage, the manufacturing yield, the efficiency, and the mutual conductance are high.

According to the present invention, a first insulative film is formed with predetermined height and thickness in a loop shape on the surface of the Schottky-junction semiconductor substrate. A gate electrode metal film is formed with a predetermined height and thickness in a loop shape on the surface of the substrate along the inner surface of the first insulative film. A second insulative film is formed with a predetermined height and thickness in a loop shape on the surface of the substrate along the inner surface of the metal film. A channel, consisting of a low-concentration impurity layer, is formed in a loop shape inside the substrate directly under the metal film and the first and second insulative films. The source region consists of a high-concentration impurity layer, which is formed such that it surrounds the channel positioned inside the substrate on the outside of the first insulative film. The drain region consists of a high-concentration impurity layer, which is formed such that it is surrounded by the channel positioned inside the substrate on the inside of the second insulative film.

With this kind of structure, it is possible to provide, with high manufacturing yield, a high performance Schottky FET device with high mutual conductance together with high drain withstand voltage, and high area efficiency.

BRIEF DESCRIPTION OF THE DRAWINGS

The present invention can be understood by reference to the accompanying drawings in which:

FIGS. 3(a) to 3(g) are cross-sectional views of the manufacturing process of the GaAs of FIG. 2.

DETAILED DESCRIPTION OF THE PREFERRED EMBODIMENT

In this invention the drain is encircled by the gate electrode. The following is a description of the gate, source and drain in an embodiment in which this invention is applied to a GaAs FET.

Figure 1:
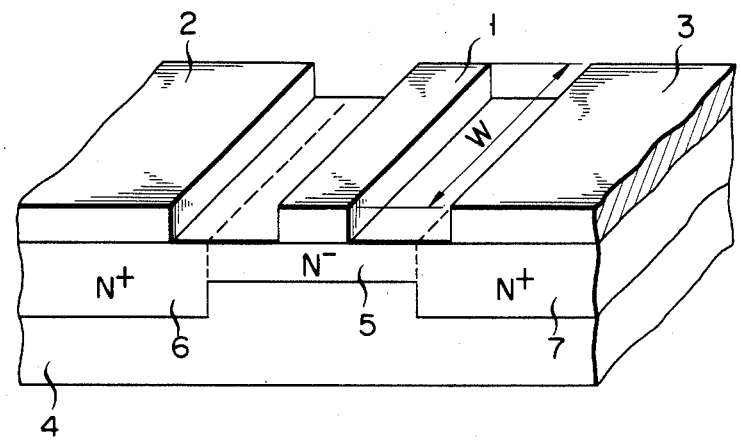
FIG. 1 is a simplified perspective view of a prior art GaAs FET structure.
Figure 2:
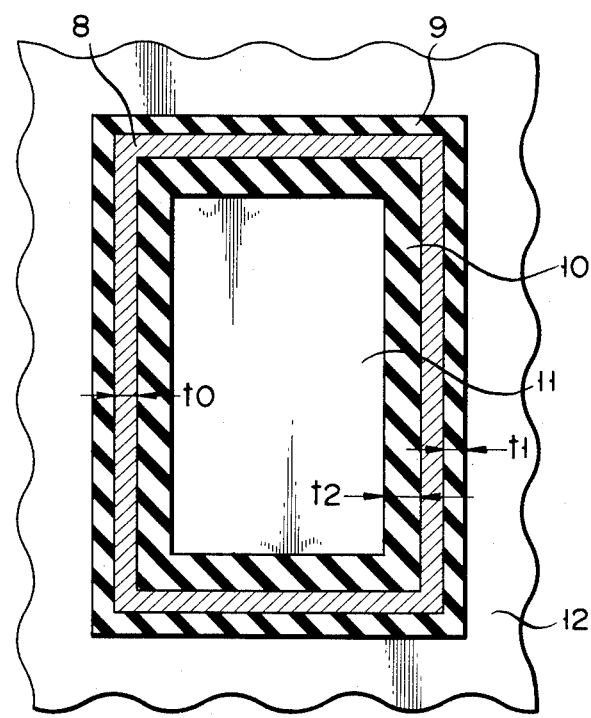
FIG. 2 is a plan view of the GaAs FET in an embodiment of this invention near the end of the manufacturing process.

In FIG. 2, reference numeral 8 denotes a metal film, which is formed vertically in a loop-shaped wall with a thickness (t0) on the GaAs semiconductor substrate (not visible), as the gate electrode. First and second wall-like insulative films 9 and 10 are deposited respectively on the outside and inside surfaces of this gate electrode metal film 8 with differing respective thicknesses t1 and t2. These three wall-like films stand vertically on the surface of the semiconductor substrate and at their base, where they contact the substrate surface, a channel (not visible) comprising a low-concentration impurity layer is formed. Accordingly, with this kind of GaAs FET the length in the conductive direction of the channel, i.e., the channel length is equal to the total thickness (t0+t1+t2) of the three films 8, 9 and 10, and the width of the channel is equal to the average peripheral length of the films. Drain region 11, which is formed of a high-concentration impurity layer, is formed on the surface of the substrate on the inner side of second insulative film 10. Source region 12, which is formed of a high-concentration impurity layer of the same conductivity as that of the drain region 11, is formed on the surface of the substrate on the outer side of the first insulative film 9.

The following is a step-by-step description of the manufacturing process of the GaAs FET with reference to FIGS. 3(a) to 3(g).

First, as shown in FIG. 3(a) an insulative film ($SiO_2$ film) of a predetermined height (e.g., over 0.5 $\mu$m) is formed by CVD over the whole surface of GaAs semiconductor substrate 14 and the N-type low-concentration impurity layer 13a, which was preformed on substrate 14. Then, a photoresist pattern is formed on the insulative film, and an island shaped insulative portion 10a and a resist film piece 15 are formed on the GaAs semiconductor substrate 14 by etching away the unneeded portions of the photoresist and the insulative film. In this case, if a reactive ion etching (RIE) method with which anistropic etching is possible is used, the periphery of the island-shaped insulative film portion 10a is formed substantially vertical to the substrate 14 surface, so RIE is desirable.

As will be explained later, the reason for making the periphery of the island-shaped insulated film portion 10a substantially vertical to the surface of the substrate 14 is to make it easier to control the film thickness t0 of metal layer 8, which defines the gate length. Namely, if the periphery of the insulative film portion 10a is made substantially vertical to the substrate 14 and when a low-pressure CVD (LPCVD) method is used for depositing metal film 8a, it is possible to deposit the film laterally with a substantially equal film thickness simply by controlling the film thickness in the vertical direction. Therefore, it is possible to control other things as well as the thickness t0 of the metal film 8.

This method is also applicable to controlling the film thicknesses t1 and t2 of the first and second insulative films 9 and 10, to be described later.

As shown in FIG. 3(b), after the resist film piece 15 on top the island-shaped insulative film portion 10a has been removed, a metal film 8a of a prescribed thickness is deposited over the entire surface by low-pressure CVD. This metal film 8a is formed of a high melting point metal (e.g., tungsten nitride WN, titanium nitride TiN or tungsten titanium silicide WTiSi) which can form a Schottky junction with the GaAs substrate 14.

The metal film 8a is removed such that only the metal film 8a deposited on the outer periphery of the insulative film 10a is left after RIE, as is shown in FIG. 3(c), and this becomes a loop-shaped gate electrode metal film 8. The film thickness t0 of the gate electrode metal film 8 is determined by the length of the gate in the GaAs FET of this invention. As in the manufacturing stage shown in FIG. 3(b), the whole surface is covered with insulative film 9a by low-pressure CVD along the dotted line shown in FIG. 3(d). Then, as in the manufacturing stage shown in FIG. 3(c), all of the insulative layer 9a except for the portion deposited on the periphery of gate electrode metal film 8 is removed by RIE to form the first insulative film 9 in close contact with the outer periphery of the gate electrode metal film 8, as is shown in FIG. 3(d). The film thickness t1 of the first insulative film 9 is prescribed by the distance between the gate and drain in the GaAs FET of this invention.

Next, as shown in FIG. 3(e), the second loop-shaped insulative film 10 is formed in close contact with the inner periphery of the gate electrode metal film 8 and the surface of substrate 14 on the inside of the second insulative film 10 is exposed by removing the center portion of insulative film portion 10a by RIE, for example. As before described for the first step a photoresist pattern is used to mask the insulative film prior to etching. The film thickness t2 of this second insulative film 10 is prescribed by the distance between gate and drain, but in this invention insulative film 10 is formed such that t2 is larger than t1.

Next, as is shown in FIG. 3(f), N-type impurity, e.g., Si is ion-implanted into the semi-conductor substrate 14, and thereafter the structure is heat-treated to form a source region 12 and drain region 11 comprised of N-type high-concentration impurity layers and to form a channel 13 under each of the layers 8, 9 and 10. FIG. 2 is a plan view of this structure.

As shown in FIG. 3(g), ohmic electrode films 16 of laid up Au-Ge alloy and platinum are deposited on the source region 12 and drain region 11 to form electrodes, and are also deposited on the top end surface of the first and second insulative films 9, 10, and the gate electrode metal film 8. In this case, after the ohmic electrode films 16 have been deposited over the entire surface, the ohmic electrode films 16 which are on the outer peripheral surface of the first insulative film 9 and on the inner peripheral surface of the second insulative film 10 are peeled off by ion milling and are left on only the wall-like first and second insulative films 9 and 10 and the gate electrode metal film 8.

In this way, after the major parts of the device have been formed, the whole surface is covered with an insulative film (not shown), contact holes (not shown) are formed, and metal films (not shown) are deposited on the contact holes to form wiring for Al, etc. After this, photoetching is performed to form the wiring pattern, and the device is complete.

The mutual conductance, the noise index as well as the drain withstand voltage of the GaAs FET of FIG. 2, which was manufactured as shown in FIGS. 3(a) to 3(g), was measured and showed a remarkable improvement over the prior art GaAs FET.

Also, with the method shown in FIG. 3, the distance margin does not become a problem. In the prior art device, a narrow distance margin resulted in a yield of only 2 to 3% whereas with this invention a yield of 60 to 70% is possible.

In the embodiment shown in the figures, the gate length, i.e., the thickness t0 of the gate electrode metal film 8, is 0.3 μm; the distance between the source and gate, i.e., the thickness t1 of the first insulative layer 9, is 0.3 μm; and the distance between the gate and drain, i.e., the thickness t2 of the second insulative film 10, is 0.5 to 1.0 μm.

As is clear from this embodiment, in this invention the gate length, gate-source distance and the gate-drain distance are easily controlled by controlling the film thickness in the vertical direction so they can be set without regard to the patterning accuracy values. Consequently, not only is it possible to set the values lower than in the prior art, it is also possible to have the gate-source distance and the gate-drain distance differ, making it possible to obtain a device with mutual conductance and drain withstand voltage that are vastly improved over the prior art GaAs FET.

Also, with this kind of structure, the gate length of the device is shorter than with the prior art, the gate width (i.e., the total peripheral length of gate electrode metal film 8) is much greater, and the distances between the gate and source, and the drain and source is much less, so channel resistance is reduced, which in turn means that the noise factor is greatly reduced over the prior art, the speed is increased, and the device is more compact.

According to the method of this invention, it is possible to manufacture a GaAs FET, which has all the advantages listed above, with a manufacturing yield that is remarkably higher than that of the prior art.

What is claimed is:

1. A process for manufacturing a Schottky FET device, comprising:
    a first step of forming an island-shaped insulative film portion on a surface of a Schottky-junction semiconductor substrate, which has a low-concentration impurity layer on the surface, with the periphery of the insulative film substantially vertical to the substrate surface;
    a second step of forming a gate electrode metal film in a loop shape and with a predetermined thickness on the outer periphery of said island-shaped insulative film portion;
    a third step of forming a first insulative film in a loop shape and with a predetermined thickness on the periphery of said loop-shaped gate electrode metal film;
    a fourth step of forming a second insulative film in a loop shape and with a predetermined thickness of the inner peripheral surface of said loop-shaped gate electrode metal film by removing the center portion of said island-shaped insulation film portion; and
    a fifth step of forming source and drain regions, which consist of high-concentration impurity layers, inside said substrate on the outside of said first insulative film and on the inside of said second insulative film by driving a high-concentration of impurities into the surface of said substrate other than on said loop-shaped gate electrode metal film and said first and second insulative films, and at the same time forming a channel of the remainder of said low-concentration impurity layer inside said substrate between said source and drain regions.

2. A process for manufacturing a Schottky FET device according to claim 1, wherein in said first step said island-shaped insulative film portion is formed using reactive ion etching.

3. A process for manufacturing a Schottky FET device according to claim 1, wherein in said second step said loop-shaped gate electrode metal film of a predetermined thickness is formed using low-pressure CVD and reactive ion etching.

4. A process for manufacturing a Schottky FET device according to claim 1, wherein in said third step said loop-shaped first insulative film of a predetermined thickness is formed using low-pressure CVD and reactive ion etching.

5. A process for manufacturing a Schottky FET device according to claim 1, wherein in said fourth step said loop-shaped second insulative film of a predetermined thickness is formed using reactive ion etching.

6. A process for manufacturing a Schottky device according to claim 1, wherein said process further comprises a sixth step of depositing ohmic electrode films on said source and drain regions, and also on top end surfaces of said first and second insulative films and gate electrode metal film.

* * * * *